US006593060B2

(12) United States Patent
Konuma

(10) Patent No.: US 6,593,060 B2
(45) Date of Patent: Jul. 15, 2003

(54) LASER THERMAL-TRANSFER FILM

(75) Inventor: Taro Konuma, Hino (JP)

(73) Assignee: Konica Corporation (JP)

( * ) Notice: Subject to any disclaimer, the term of this patent is extended or adjusted under 35 U.S.C. 154(b) by 0 days.

(21) Appl. No.: 09/952,163

(22) Filed: Sep. 14, 2001

(65) Prior Publication Data

US 2002/0061468 A1 May 23, 2002

(30) Foreign Application Priority Data

Sep. 18, 2000 (JP) ....................................... 2000-281852

(51) Int. Cl.$^7$ .............................. G03F 7/34; G03F 7/11

(52) U.S. Cl. ..................... 430/271.1; 430/200; 430/201

(58) Field of Search ................................ 430/200, 201, 430/271.1

(56) References Cited

U.S. PATENT DOCUMENTS

| | | | | | |
|---|---|---|---|---|---|
| 5,312,683 | A | * | 5/1994 | Chou et al. | 430/200 |
| 5,464,723 | A | * | 11/1995 | Chou | 430/200 |
| 5,501,937 | A | * | 3/1996 | Matsumoto et al. | 430/200 |
| 6,165,671 | A | * | 12/2000 | Weidner et al. | 430/200 |
| 6,190,827 | B1 | * | 2/2001 | Weidner | 430/200 |
| 6,197,474 | B1 | * | 3/2001 | Niemeyer et al. | 430/200 |

* cited by examiner

*Primary Examiner*—Richard L. Schilling
(74) *Attorney, Agent, or Firm*—Muserlian, Lucas and Mercanti

(57) ABSTRACT

A laser thermal-transfer to transfer an ink image by being imagewise exposed with a laser beam, comprising: at a support; a photo-thermal conversion layer; and an ink layer having at least one kind of a thermoplastic resin and a pigment,
wherein an average transmittance of the ink layer for a light having wavelength of 350 to 650 nm is not more than 70% and L* value of the ink layer is not less than 60.

12 Claims, No Drawings

LASER THERMAL-TRANSFER FILM

FIELD OF THE INVENTION

The present invention relates to a laser thermal-transfer film that is used for the so-called heat mode laser recording method to obtain a highly fine and detailed image by the use of laser radiation, and in particular, to a laser special colors (hereinafter referred to also as special colors) such as white, silver and gold in DDCP (Direct Digital color Proof).

BACKGROUND OF THE INVENTION

In recent years, in the field of graphic arts, there have been proposed DDCPs that output a highly fine and detailed image by using laser radiation, as a digital color proof which can obtain an output equivalent to printing (such as offset printing, gravure printing and so on), by inputting digital data directly, under introduction of CTP (computer to plate). Among them, a recording method of a laser thermal-transfer type employing the same pigment as in printing is attracting public attention, from viewpoints that the same color tone as in printing on printing paper can be obtained, proof-reading is possible, and halftone dots can be As a color to be used for printing, process colors represented by four colors of yellow, magenta, cyan and black are usually needed, and even in the laser thermal-transfer type recording method, those employing pigments which arc the same as the aforesaid process colors have been developed.

In printing, on the other hand, colors called special colors are also needed in addition to the four colors stated above, as colors to be reproduced in DDCP. For example, there are demanded high-fidelity reproductions for intermediate colors which can be reproduced by color mixture of yellow, magenta, cyan and black, colors which cannot be expressed only by mixing of the aforesaid four colors, and using organic pigments and inorganic pigments accordingly, and colors such as gold, silver and white, which have metallic luster and/or covering power and can be reproduced only by inorganic pigments.

Among the above-mentioned colors, intermediate colors which can be reproduced by using the four colors and colors can be reproduced easily by dispersing and blending pigments and by making them to be contained in an ink layer, in the same way as in yellow, magneta, cyan and black.

However, with regard to special colors which can be reproduced only by using inorganic pigments, various delicate conditions are needed for reproduction of those special colors, and sufficient sensitivity and satisfactory image quality have not been obtained yet, under the existing circumstances.

An object of the invention is to provide a laser reproducing special colors which cannot be reproduced by organic pigments, with texture equivalent to that of printing.

SUMMARY OF THE INVENTION

For reproduction of special colors which cannot be reproduced without using inorganic pigments, he inventors of the present invention have solved the problems mentioned above by changing a design of the structure of an ink layer from that for conventional process color. Namely, the object of the invention has been attained by the following structures.

Structure 1

A laser thermal-transfer to transfer an ink image by being imagewise exposed with a laser beam, comprising: a support; a light-heat conversion layer; and an ink layer having at least one kind of a thermoplastic resin and a pigment, wherein an average transmittance of the ink layer for a light having wavelength of 350 to 650 nm is not more than 70% and L* value of the ink layer is not less than 60.

Structure 2

The laser thermal-transfer film according to the above structure 1, wherein the ink layer comprises the thermoplastic resin of 10% by weight or less and the density of the ink layer is 1.2 to 4 kg/l.

Structure 4

The laser thermal-transfer film according to the above structure 1, wherein the ink layer comprises the thermoplastic resin of 77% by weight or less and the pigment of 20% by weight or more, and the density of the pigment is 2.0 kg/l or more.

Structure 4

The laser thermal-transfer film according to the above structure 1, wherein the pigment comprises at least one compound selected from the group consisting of a titanium compound, an aluminum compound, a lead compound, a silver compound, a molybdenum compound, an iron compound, a copper compound and a zinc compound.

Structure 5

The laser thermal-transfer film according to the above structure 1, wherein the thermoplastic resin comprises a first thermoplastic resin having a melting point or a softening point of 140° C. or less and a second thermoplastic resin having a melting point or a softening point of 150° C. or more, and the ink layer contains the first thermoplastic resin of 8 to 55% by weight and the second thermoplastic resin of 2.0% by weight or more.

Structure 6

The laser thermal-transfer film according to the above structure 1, wherein dispersion average diameter of the pigment is not more than 2.0 $\mu$m.

Structure 7

The laser thermal-transfer film according to the above structure 1, wherein the thickness of the ink layer is not more than 2.0 $\mu$m.

Structure 8

The laser thermal-transfer film according to the above the structure 1, wherein the weight of the ink layer is not less than 0.8 g/$m^2$.

Structure 9

The laser thermal-transfer film according no the above structure 1, wherein an average transmission density of the ink layer for a light having a wavelength of 350 to 650 nm is not more than 0.0.

Structure 10

The laser thermal-transfer film according to the above structure 4, wherein the pigment comprising at least a dioxide, aluminum powder and bronze powder.

Structure 11

The laser thermal-transfer film according to the above structure 1, wherein the laser thermal-transfer film further comprises a cushion layer between the support and the light-heat conversion layer.

DETAILED DESCRIPTION OF THE INVENTION

A laser thermal-transfer film of the invention is a film having at least a light heat converting ability and an ink (coloring material) transferring ability, and it can be provided, when necessary, with an easy adhesion layer between a light-heat conversion layer and a support as well as an intermediate layer between the light-heat conversion layer and an ink layer, and the layer thermal-transfer film can further be provided, when necessary, with a back coating layer on the side opposite to that for the easy adhesion layer and the intermediate layer.

An ink layer related to the laser thermal-transfer film of the invention will be explained as follows.

The ink layer related to the invention is characterized to contain at least one typo of a thermoplastic resin and a pigment. In a laser thermal-transfer method, the ink layer is a layer that is melted or softened through heating and can be transferred in a form of a layer containing coloring agents and thermoplastic binders, which makes it unnecessary to transfer in the state of perfect melting.

In the invention related to Structure 1, an ink layer is characterized to contain at least one type of a thermoplastic resin and a pigment, and its average transmittance of the ink layer for a light having wavelength of 350 to 650 nm is not more than 70% and L* value is not less than 60. By setting average transmittance of the ink layer for the light having wavelength of 350 to 650 nm and L* value of the ink layer to be within the conditional range of the invention, it is possible to attain excellent color reproducibility for special colors and to obtain excellent image quality. Further, for obtaining color reproducibility which is more excellent, it is preferable to make average transmittance of the ink layer for the light having wavelength of 350 to 650 nm to the ink layer to be within a range of 44–60% and L* value is not less than 70.

The average transmittance (T %) mentioned in the invention is one obtained by averaging transmittance in the wavelength area of 350–650 nm, and it can be obtained by the following method.

A sample wherein an ink layer coating solution is coated as dry mass of 2.0 g/$m^2$ on a 35 μm-think polyethylene terephthalate support is prepared, and its transmittance is measured from the direction of the side which the ink layer provided, by an autospectral photometer of HITACHI U-3000/3300 Type made by Hitachi, Ltd., for example, thus, the average transmittance is obtained by averaging transmittance for a light having wavelength of 350 to 650 nm.

The L* value mentioned in the invention is an L* value in CIE LAB space, and with regard to the L* value, a measurement is conducted in accordance with "Measuring method for object color" of JIS Z 8722 1982 to obtain three stimulating values X, Y and Z, and L* can be obtained by "Indication method for object color by L*a*b* color system and L*u*v* color system" of JIS Z 8729-1980. An example of a concrete measuring method will be explained as follows.

A sample wherein an ink layer coating solution is coated as dry mass of 2.0 g/$m^2$ on a 25 μm-thick polyethylene terephthlate support is prepared, and the sample is placed on a black packing under he conditions of D50 and a field of view of 2°, by using GRETAG SPM100-II made by Gretag-Macbeth Ltd., for example, to measure and obtain L* of the ink layer.

In the invention related to Structure 4, it is characteristic that a pigment comprises a compound selected from a group of a titanium compound, an aluminum compound, a lead compound, a solver compound, a molybdenum compound, an iron compound, a copper compound and a zinc compound, and it is preferable that a pigment capable of being used in the invention is an inorganic pigment including, for example, an iron oxide ($Fe_2O_3$), white lead ($2PbCo_3.Pb\ (OH)_2$), red lead ($Pb_3O_4$) chrome yellow ($PbCrO_4$), vermilion (HqS), ultramarine ($Na_6Al_5Si_6O_{24}S_4$), cobalt oxide (Coo.or $Co_3C_4$), titanium dioxide ($TiO_2$), titanium dioxide-covered mica ($TiO_2$/$K_{20}.3Al_2O_3.6SiO_2.2H_2O$), strontium chromate ($ScCrO_4$), titanium-yellow (nickel yellow, chrome yellow), iron black ($Fe_3O_4$), molybdenum red ($PbCrO_4$.$nPbMCO_4.mPbSO_4.xAl\ (OH)_2$), molybdenum white ($ZnMoO_4$.Zno or $CaZnMoC_4.CacO_3$), lithopone ($BaSO_4$.ZnS) cadmium red (CdS-nCdSe), bronze powder (alloy of copper and zinc) and aluminum powder. In particular, preferable pigments for reproduction of a special color such as white, silver and gold are titanium dioxide, aluminum powder and bronze powder. Further, with regard to reproduction of gold, it is also possible to add yellow or red organic pigments or inorganic pigments to aluminum powder.

In the invention related to Structure 3, it is one of characteristics to use a pigment having density of 2 kg/l or more, and by using a pigment satisfying this condition, preferable reproduction of special colors can be realized, and more preferable is a pigment having density of 2.5 kg/l or more.

In the invention related to Structure 6, it is characteristic that the dispersion average diameter of the pigment is not more than 2.0 μm. In the invention, the dispersion average diameter of the pigment can be measured by a laser diffraction type particle size distribution measuring apparatus (for example, MASTERSIZER produced by Malvern Instruments Ltd.). When reproducing metallic luster, the greater the dispersion average diameter of the pigment is, the more the feeling of luster is caused. In the case of white pigment requiring no metallic luster, however, it is preferable to make the dispersion average diameter to be 2.0 μm and less, from the viewpoint of laser thermal-transfer property and image quality. When the dispersion average diameter is greater, adhesion to an image reception area is lost, and sensitivity is lowered. As a white pigment. titanium oxide is most preferable, and in particular, the dispersion average diameter ranging from 0.2 μm to 0.3 μm causes the maximum covering power.

In the invention related to Structure 2, it is a characteristic that density of the ink layer is 1.2–4.0 kg/l. For obtaining excellent color reproducibility and thermal transfer power, density of the ink layer of 1.2–4.0 kg/l is preferable, and for obtaining more sufficient color reproducibility and thermal transfer power, density of this ink layer of 1.5–3.3 kg/l is preferable.

In the ink layer of the invention, it is one of characteristics that thermoplastic resin is used as a binder, further, in the invention related to Structure 2, it is one of characteristics that thermoplastic resins in quantity of 10% by weight or more are contained, in the invention related to Structure 3, it is one of characteristics that thermoplastic resins in quantity of 77% by weight and less are contained, and in the invention related to Structure 5, it is characteristic that a first thermoplastic resins of 8 to 55% by weight whose melting point or softening point is not more than 140° C. are contained and a second thermoplastic resins of 2% by weight or more whose melting point or softening point is not less than 150° C. are contained. When the structure of the ink layer satisfies the conditions of the invention, it is possible to obtain a laser thermal-transfer film having excellent thermal-transfer property, fine line reproduction and solid image quality. For obtaining thermal-transfer property and fine line reproducibility which are further sufficient, it is preferable to lower the softening point of the thermoplastic resin as far as possible, and a range of 40–120° C. is preferable, while that in terms of Tg of 40–60° C. is more preferable. For the further improvement of sensitivity, it is also possible to add various types of plasticizers and heat solvents. For obtaining solid image quality which is more excellent, it is preferable that the second thermoplastic resin in quantity of 5 to 12% by weight is contained.

A softening point mentioned in the invention is a value obtained through measurement by TMA (Thermomechanical Analysis), and it is obtained by raising temperature of an object to be measured at a constant temperature-raising speed while applying a constant load, and thereby by observing a phase of the object to be measured. In the invention, the temperature at which the phase of the object to be measured starts changing is defined as a softening point. Measurement of the softening point by TMA can be conducted by the use of an instrument such as Thermoflex made by Rigaku Electric Co.

Though there is no limitation, in particular, for thermoplastic resins capable of being used in the invention, there are preferably given ethylene type copolymer, polyamide type resins, polyester type resins, styrene type resins, polyurethane type resins, polyolefin type resins, acryl type resins, vinyl chloride type resins, cellulose type resins, rosin type resins, polyvinyl alcohol type resins, polyvinyl acetal type resins, ionomer resins, petroleum type resins, and resins for an ink layer binder described in TOKKAIHEI No. 6-312583. in addition to the thermoplastic resins stated above, those capable of being used together with the foregoing in the invention include elastomers such as natural rubber, styrene butadiene rubber, isoprene rubber, chloroprene rubber, and diene type copolymer; rosin derivatives such as ester rubber, rosin maleic acid resins, rosin phenol resins, and hydrogenation rosin; and high polymers such as phenol resins, terpene resins, cyclopentadiene resins, and aromatic hydrocarbon resins, and waxes.

In the invention related to Structure 8, it is a distinguishing feature that an adhesion amount of an ink layer is 0.8 $g/m^2$ or more, and an amount of 1.2 to 5.0 $g/m^2$ is further preferable. Further, in the invention related to Structure 7, it is a distinguishing feature that a layer thickness of an ink layer is 2.0 $\mu$m and less, and 0.5 to 1.8 $\mu$m is preferable. When an adhesion amount of an ink layer having an area of 1 $m^2$ is less than 0.8 $g/m^4$, sufficient color reproduction cannot be obtained, and when an adhesion amount of an ink layer is not less than 5.0 $g/m^2$, or when a layer thickness is not less than 2.0 $\mu$m, neat capacity of the ink layer turns out to be greater, resulting in inability of obtaining sufficient thermal transfer sensitivity and in deterioration of resolving power, which is not preferable.

In the invention related to Structure 9, it is a distinguishing feature that an average transmission density of the ink layer for a light having a wavelength of 350 to 650 nm is not more than 0.8, and the average transmission density within the range of 0.2 to 0.45 is more preferable. By setting the average permeability density of the ink layer within the range of the invention, it is possible to obtain excellent color reproducibility for special colors.

Next, a support which can be used for the laser thermal-transfer film of the invention will be explained.

There is no limitation for a support provided that the support has stittness and is excellent in stability for dimensions, excellent in smoothness, and is proof against heat in image forming, and there are concretely given various types of papers such as a sheet of paper, a coated paper and a synthetic paper (polypropylene, polystyrene, or a composite material wherein polypropylene or polystyrene is laminated on paper), various types of plastic films or sheets in a single layer or multi-layer of not less than two layers such as vinyl chloride type resin sheet, ABS resin sheet, polyethylene terephthalate film, polyacrylate film, polycarbonate film, polyether ketone film, polysulfone film, film, polyethylene naphthalate film, polystyrene film, polycarbonate film, polyether ketone film, polysulfone film, polyetersulfone film, polyetherimide film, polyimide film, polyethylene film, polypropylene film, polystyrene film, syndioctactic polystyrene, oriented nylon film, polyacerate film and polymethyl methacrylate film, various types of films or sheets each being made of metal, various types of films or sheets each being made of ceramic, metal sheets such as those of aluminum, stainless steel, chromium and nickel, and those wherein a metallic thin layer is laminated or metallized on a resin-coated paper These supports can also be subjected to various types of processing including a dimension stabilizing processing and an antistatic processing. Antistatic agents used widely include cation type surface active agents, anion type surface active agents, nonionic surface active agents, polymer antistatic agents, conducting tine-grains and compounds described on 875–876 pages of "11290 chemical products" published by The Chemical Daily Co., Ltd.

Further, these supports may also be subjected to known surface modification treatments. As these surface modification treatments, there arc given flame-throwing treatment, sulfuric acid treatment, corona discharge treatment, plasma treatment and glow discharge treatment. Further, an adhesion layer may Also be provided on the support stated above so that an ink layer and each layer described later may be coated properly on the support. There is no limitation for the adhesion layer, in particular, and those having known structure may be used. A method for providing the adhesion layer includes, for example, an aqueous resin coating method, a solvent type resin coating method, an aqueous latex coating method and a hot-melt coating method.

In general, it is advantageous, from the viewpoint of cost and stability, to provide an adhesion layer in the course of manufacturing a support, and from this point, preferable is a method to coat a latex of, for example, acrylic resins, polystyrene resins, polyester resins, urethane resins or polyethylene/vinyl acetate resins, to which, however, the invention is not limited in particular. Base films each being provided with this adhesion layer are marketed by various companies, and these can be used favorably in the invention.

In the case of imaging forming by radiating laser radiation from the transfer material side, it is preferable that a support of the transfer material is transparent. From the viewpoint of easy superposition, it is preferable that a support of the transfer material is thinner than an image reception sheet, and a thickness of 30 to 150 $\mu$m is generally preferable, and that of 50 to 100 $\mu$m is more preferable.

As a binder used for a back coating layer, there can he used general-purpose polymers including gelatin, polyvinyl alcohol, methyl cellulose, nitro cellulose, acetyl cellulose, aromatic polyamide resins, silicone resins, epoxy resins, alkyd resins, phenol resins, melamine resins, fluorine resins, polyimide resins, urethane resins, acryl resins, urethane denatured silicone resins, polyethylene resins, polypropylene resins, polyester resins, Teflon resins, polyvinyl butyral resins, vinyl chloride type resins, polyvinyl acetate, polycarbonate, organic boron compounds, aromatic esters, polyurethane fluoride and polyether sulfone. Use of a crosslinkable and water-soluble binder as a binder for a back coating layer to make the binder to crosslink is effective for preventing power falling of matting agent and for improvement of abrasive resistance of the back coating. It is also effective greatly for blocking in the case of storage. This crosslinking means can be used without limiting any one of heat, actinic light and pressure, or combination thereof depending on characteristics of crosslinking agents to be used. In certain circumstances, an optional adhesion layer may be provided on the side of a support where a back coating layer is provided, for giving adhesiveness to the support.

It is preferable to make the bank coating layer to contain matting agents. As a matting agent to he added preferably to the back coating layer, organic or inorganic fine-grains may be used. As an organic type matting agent, there are given polymethyl methacrylate (PMMA) polystyrene, polyethylene, polypropylene, fine-grains of other radical polymerization type polymer, and fine-grains of condensation polymer such as polyester and polycarbonate. It is preferable that the back coating layer is provided under the condition of an adhesion amount of about 0.5–5 g/$m^2$. When the adhesion amount is less than 0.5 g/$m^2$, coating behavior is unstable and a problem of power falling of matting agent tends to occur. When coating is conducted under the condition of the adhesion amount exceeding greatly 5 g/$m^2$, a grain size of appropriate matting agent turns out to be large extremely, and embossing on the surface of an ink layer caused by back coating is caused in the course of storage, and minimum density and unevenness on recorded images tend to occur, especially in the case of thermal transfer: for transferring a thin ink layer. Matting agents whose number average grain size is greater than a layer thickness of only a binder of a back coating layer by 1–20 $\mu$m are preferable. In the matting agents, grains whose grain size is 2 $\mu$m or more are needed to be present at a rate of 1 mg/$m^4$ or more, and the rate of 2 to 600 mg/$m^2$ is preferable. By virtue of this, troubles caused by foreign substances are remedied in particular. By using matting agents having narrow grain size distribution wherein value $\sigma/r_n$ coefficient of variation of grain size distribution) obtained by dividing a standard deviation of grain size distribution with the number average grain size is 0.8 and less, it is possible to remedy the defect caused by grains having an extraordinarily large grain size, and to obtain desired performances with less added amount. It is further preferable that the coefficient of variation is not more than 0.15.

It is preferable to add antistatic agents to a back coating layer, for preventing adhesion of foreign matters caused by triboelectritication produced by friction with a conveyance roll in the course of sheet supply. Antistatic agents used widely include cation type surface active agents, anion type surface active agents, nonionic surface active agents, polymer antistatic agents, conducting fine-grains and compounds described on 875–876 pages of "11290 chemical products" published by The chemical Daily Co., Ltd. Among the substances stated above, metallic oxides ouch as carbon black, zinx oxide, titanium oxide and tin oxide, and conducting fine-grains such as organic semiconductors are preferably used, as antistatic agents which can be used jointly for a back coating layer. In particular, using of conducting fine-grains is preferable because there is no dissociation of antistatic agents from the back coating layer, and stable antistatic effect can be obtained accordingly, independently of ambient conditions. It is also possible to add releasing agents such as various active agents, silicone oil and fluororesins to the back coating layer, to give coatability and releasing characteristics. The black coating layer is especially preferable when a softening point obtained through measurement by TMA (Thermomechanical Analysis) is 70° C. and less TMA softening paint is obtained by raising a temperature of an object to be measured at a certain temperature-raising speed while applying a certain load on the object, and by observing a phase of the object to be measured. In the invention, the temperature at which, the phase of the object to be measured starts changing is defined ad TMA softening point. Measurement of the softening point by TMA can be conducted by the use of an instrument such as Thermoflex made by Rigaku Electric Co.

In the laser thermal-transfer film of the invention, it is preferable to provide a cushion layer between a support and a light-heat conversion layer or to use a cushion-like support, for enhancing close adhesion between a transfer material and an image reception material. The cushion layer provided for enhancing close adhesion between a transfer material and an image reception material is a layer having a thermosoftening property or elasticity, and those softened and deformed sufficiently through heating, a material having low elastic modulus or a material having rubber elasticity, may be used for the cushion layer. Further, the cushion layer is a layer having a cushion-like property, and an elastic modulus or a penetration can be utilized as an index; indicating the cushion-like property mentioned here. For example, it has been confirmed that layers having elastic modulus of about 1 to 250 kg/$mm^2$ at 25° C. and penetration stipulated in JIS K2530-1976 in a range of 15 to 500, more preferably of about 30 to 300, show a cushion-like property that is appropriate for forming a color proof image for color proofing, and they can be selected properly, because a requested extent varies depending on application of the image in a target. A cushion layer whose TMA softening point is not more than 70° C. is preferable, and more preferable is not more than 60° C.

Preferable characteristics of the cushion layer are not always prescribed by the type of a material alone, and a material whose characteristic is preferable includes polyoletin resins, ethylene-vinyl acetate copolymer, ethylene-ethylacrylate copolymer, polybutadiene resins., styrene-butadiene copolymer (SBR), styrene-ethylene-butane-styrelle copolymer (SEBS), acrylonitrile-butaoiene copolymer (NDR), polyisoprene resins (IR), styrene-isoprene copolymer (SIS), acrylic acid ester copolymer, polyester resins, vinyl chloride vinyl acetate resins, polyurethane reins, vinyl resins, bytyl rubber and polynorbornen. Among the foregoing, those having relatively low molecular weight tend to satisfy necessary conditions of the cushion-like property, but they cannot be limited due to he connection with their materials. Though the cushion layer can be provided through coating of solvents, it is also possible to form by coating under the state of a water-based dispersion such as a latex or an emulsion. In addition to the foregoing, water-soluble resins can be used. These resins can be used independently or in combination, as occasion demands. Further, even for the materials other than the foregoing, it is possible to give characteristics preferable for a cushion layer by adding various types of additives to the materials. These additives include low-melting point substances such ac wax and plasticizer. To be concrete, there are given phthalic acid ester, adipic ester, glycolester, ester of fatty acid, phosphoric ester and chlorination paraffin. It is further possible to add various additives described, for example, in "Practical Handbook of additives for Plastic and Rubber" issued by Chemical Industry Co. (issued in 1970). With regard to an added amount of these additives, it is possible to select an amount necessary to create preferable physical properties under the combination with materials of a cushion layer that is a base, and 10% by weight or less, further 5% by weight or less of an amount of materials of a cushion layer is generally preferable, though there is no limitation in particular.

A method to be applied for forming a cushion layer includes a coating method such as a blade coater, a roll coater, a bar coater, a curtain coater and a gravure coater for coating those wherein the aforesaid materials are dissolved in a solvent or the materials are dispersed in a form of a latex and a hot-melt extrusion laminating method. As a specific cushion layer, it is possible to use a resin layer of a void structure wherein thermosoftening or thermoplastic recino are made to foam. It is preferable that a layer thickness of a cushion layer is 0.5–10 $\mu$m, and more preferable is 1–7 $\mu$m.

Next, a photo-thermal conversion layer in a layer thermal-transfer film of the invention will be explained. The light-heat conversion layer is a layer having a light-heat converting ability. It is preferable that the light-heat conversion layer is provided between a support and an ink layer, and it is more preferable that the light-heat conversion layer is provided between a support and an ink layer or between an easy adhesion layer and an ink layer.

As a binder in the light heat conversion layer, it is possible to use resins having high Tg and high thermal conductivity exemplifying an ordinary heat-resisting resin such as polymethyl methacrylate, polycarbonate, polystyrene, ethylcellulose, nitrocellulose, polyvinyl alcohol, polyvinyl chloride, polyamide, polyamide acid, polyimide, polyetherimide, polysulfone, polyethersulfone and aramid, and polymer compounds composed of polythiofenes, polyanilines, polyacetylenes, polyphenylenes, polyphenylene sulfido, polypyrrole and derivatives thereof or mixtures thereof. With regard to the binder in the light-heat conversion layer, it is preferable to use, as a highly heat-resistant light-heat conversion layer binder, a binder whose temperature at which mass attenuation rate in a nitrogen stream and under the condition of temperature-raising speed of 10° C./min. is 50% under the pyrolysis measurement by TGA method is 360° C. or more. As this binder, a part of polyvinyl alcohol and polyamide acid among various types of engineering plastics are suitable for coating, because they show excellent solubility in a general purpose solvent.

By making various types of releasing agents to be contained in the light-heat conversion layer, it is possible to improve releasing properties between the light-heat conversion layer and an ink layer, and to improve sensitivity. As a releasing agent, silicone type releasing agents (polyoxyalkylene denatured zilicone oil, alcohol denatured silicone oil), fluorine type surface active agents (perfluoro phosphoric acid ester type surface active agents), and other surface active agents are effective. When light-heat conversion materials are used, substances which absorb light and convert it into heat efficiently are preferable although this depends on a light source, and when using a semiconductor laser as a light source, for example, substances having an absorption band in a near-infrared zone are preferable. Examples of near-infrared radiation absorbing agents used favorably include organic compounds such as carbon black and dyes of cyaninc type, polymethine type, azulenium type, squalium type, thiopyrilium type, naphthopquinore type and anthraguinone type, and organic metal complexes of pythalocyanine type, azo type and thioamide type. To be concrete, there are given compounds described in TOKKAISHO Nos. 63-139191 and 64-33547 and TOKKAIHEI Nos. 1-160683, 1-280750, 1-293342, 2-2074, 3-26593, 3-30991, 3-34891, 3-36093, 3-36094, 3-36095, 3-42281, 3-97589 and 3-103476. These compounds can be used independently or in combination of two kinds or more of them. It is preferable that a thickness of the light-heat conversion layer is 0.05 to 3 $\mu$m, and more preferable is 0.1 tro 1.0 $\mu$m. Content of the light-heat conversion materials in the light-heat conversion layer can be determined so that absorption at the wavelength of a light source used for image recording may usually be in a range of 0.3 to 3.0, and more preferably be in a range of 0.7 to 2.5.

In the invention, it is preferable that absorption of a light-heat conversion layer is established properly depending on a type of a coloring material. Namely, when absorption of an ink layer at the wavelength for exposure is less than 0.2, it is preferable that absorption of a light-heat conversion layer at the wavelength for exposure is 0.4–1.0, while, when absorption of the ink layer at the wavelength for exposure is not less than 0.2, it is preferable that absorption of the light heat conversion layer at the wavelength for exposure is 0.6 to 1.2. As stated above, adjustment of absorption of a light-heat conversion layer made in absorption of a light-heat conversion layer effective for improving unevenness of laser scanning that is caused in the course of laser exposure thermal-transfer.

Absorption of a light-heat conversion layer may be selected properly within the range stated above, by power of a laser to be radiated, a layer thickness of the light-heat conversion layer, and a layer thickness and absorption of an ink layer.

As the light heat conversion layer, a metalized layer can be used in addition to the foregoing, and there are given a metalized layer of metal black such as carbon black, gold, silver, aluminum, chromium, nickel, antimony, tellurium, bismuth and selenium, and a metalized layer of metal elements in groups of Ib, Iib, IIIa, Ivb, Va, Vb, Via, Vib, VIIb and VIII of the periodic table, a metalized layer of an alloy of the aforesaid metal elements, or a metalized layer of an alloy of the aforesaid metal elements and elements in groups of Ia, Iia and IIIb, or a metalized layer of mixture of the foregoing. The metal that is preferable in particular includes Al, Bi, Sn, In or Zn and an alloy of these metals, or an alloy of these metals and elements in groups of Ja. TiA and IIIb, or the mixture of the aforesaid metals and alloys. Appropriate metallic oxide or sulfide includes compounds of Al, Bi, Sr, In, Zn, Ti, Cr, Mo, W, CD, Ir, Ni, Pb, Pt, Cu, Ag, Au, Zr or Te, or mixtures of them. There are further given metalized layers of metal phthalocyanine, metal dithioreine and anthraquinone. A layer thickness of a metalized layer that is within 500 angstroms is preferable. Incidentally, the light-heat conversion material may be a coloring material itself of an ink layer, or it can be selected from various substances without being limited to the foregoing. When adhesion property between a light-heat conversion layer and a lower layer on the support is insufficient, it is possible to provide an adhesion layer between the lower layer on the support and the light-heat conversion layer, because there is a risk that peeling is caused, resulting in color contamination, when exfoliating a transfer material from an image reception material, in the course of radiating light or after thermal transfer.

Next, an image reception material capable of being used in the invention will be explained.

As an image reception material capable of being used in the invention, there is given one which receives an ink layer exfoliated from a transfer material on an imagewise basis and forms an image. The image reception material is usually provided with a support and an image reception layer, and it is sometimes composed only of a support. Since an ink layer melted by heat is transferred onto the image reception material, it is preferable that the image reception material has appropriate heat resisting power and it is excellent in dimensional stability so that an image may be formed properly.

An image reception layer formed on a support is composed of a binder and of various types of additives and matting agents added as occasion demands. Or, in some cases, it is composed only of a binder. As a binder for an image reception layer having an excellent image reception property, there are given adhesive agents such as polyvinyl acetate emulsion type adhesive agents, chloroprene type adhesive agents and epoxy resin type adhesive agents, natural rubber, gluing agents such as resins of a chloroprene rubber type, a butyl rubber type, a polyacrylate ester type, a nitrile rubber type, a polysultide type, a silicone rubber type, a rosin type, a vinyl chloride type and a petroleum type, and ionomer resin, recycled rubber, SBR, polyisoprene and polyvinyl ether.

When an image formed on the image reception layer is transferred again onto another recording medium through further heating and/or pressure, resins whose polarity is relatively small (SP value is small) is especially preferable for the image reception layer. Examples of them include polyethylens, polypropylene, ethylene—vinyl chloride copolymer, polybutadiene resins, ethylete—acryl copolymer, vinyl chloride type resins and various denatured olefins.

Though a thickness of the image reception is usually 1–10 μm, this does not necessarily apply to the occasion wherein a cushion layer is used as an image reception layer. A cushion layer described with transfer material can be used as a cushion layer.

As a support of an image reception material, the one identical to that explained in the transfer material can be used, and its thickness of 30 to 200 μm is preferable, and more preferable is so to 125 μm.

In addition to the foregoing, it is possible to provide a stripping layer between an image reception layer and a support, more preferably between an image reception layer and a cushion layer, and to provide a back coating layer and an antistatic coating on the surface of the support that is opposite to the image reception layer.

A laser thermal transfer recording method used in the invention is a method wherein, transfer of an ink layer may he any one of melting type transfer, transfer by means of abrasion and transfer of a sublimation type, and a laser beam is converted into heat and its heat energy is used to transfer an ink layer onto an image reception material so that an image is formed on the image reception material Among them, the melting type and the abrasion type are preferable on the point to form an image having hue similar to that in printing.

In a detailed explanation of the foregoing, the laser thermal transfer recording method which can be used in the invention is a method wherein each of rolled image reception material and transfer material is fad out successively from a feed out section, then, the image reception material and transfer material thus fed out are wound around an exposure drum in succession to be held in a manner of close contact under diminished pressure, and a laser beam is radiated to the transfer material from its reverse side in accordance with image data, so that the laser beam is absorbed by the transfer material to be converted into heat by which an image is transferred from the transfer material to the image reception material.

An infrared laser light source used tar laser thermal transfer includes a semiconductor laser, YAG laser, a carbonic acid gas laser and a helium neon laser. Among the semiconductor lasers, the so-called single mode laser diode is preferably used, because it is easy to converge to $1/c^2$ and a diameter of several μm several tens μm at a focus without lowering the optical efficiency greatly. A light source other than a lacer includes a light emitting diode (LED). Though a multi-channel lacer light source is used in the invention, an LED and a semiconductor lacer can be used easily as an array wherein a plurality of light-emitting elements.

As a method of laser scanning, a method of scanning on an outer cylindrical surface and that of scanning on an inner cylindrical surface are suitable for high density recording, because accuracy of an optical system can easily be enhanced. In the case of the multi-channel exposure wherein a plurality of light omitting elements are simultaneously used, the method of scanning on an outer cylindrical surface is the best suited.

EXAMPLES

The invention will be explained as follows, referring to the examples to which, however, an embodiment of the invention is not limited. Incidentally, unless otherwise specified, “parts” described in the example is indicated with “parts by mass” for effective solid parts.

Example 1

(Preparation of a Thermal-Transfer Film)

(Preparation of Thermal-Transfer Film 1)

[Forming Light-Heat Conversion Layer 1]

Light-heat conversion layer coating solution 1 described below was coated on a 75 μm-thick polyethylene terephthalate film (705 made by Teijin DuPont Films Japan Limited.) with a wire bar to be dried, and thereby, light-heat conversion layer 1 whose transmission absorption density at a wavelength of 830 nm was formed. Dry mass of the light-heat conversion layer 1 was 0.67 $g/m^2$.

(Light Heat Conversion Layer Coating Solution 1)

| | |
|---|---|
| Polyvinyl alcohol (RS-110 made by KURARAY CO., Ltd.) | 3.6 parts |
| Carbon black water dispersion (CAB-O-JET300 made by CABOT Co.) | 2.1 parts |
| Boric acid | 0.24 parts |
| Flourine surface active agent (FT-251 made by NEOS CO., LTD.) | 0.06 parts |
| Water | 75.2 parts |
| Isopropyl alcohol | 18.8 parts |

Ink layer coating solution 1 described below was coated on the light-heat conversion layer 1 with a wire bar to be dried, and thereby, ink layer 1 having dry mass 2.0 $g/m^2$ was formed, and thermal-transfer film 1 was prepared. The thermal-transfer film 1 thus prepared was wound around a sheet cube having an outside diameter of 1.62 cm (3 inches), in a way that the ink layer surface is positioned to be (Ink Layer Coating Solution 1)

Pigment-dispersed solution 1 was prepared under the following structure.

| | |
|---|---|
| White pigment (titanium oxide specific gravity 4.1) | 60.0 parts |
| Dispersing agent A (Solsperse 5000 made by ICI Co.) | 1.0 part |
| Dispersing agent B (Solsperse 24000 made by ICI Co.) | 5.0 parts |
| Methyl ethyl ketone | 34.0 parts |

Then, the pigment-dispersed solution 1 prepared was used for preparing layer coating solution 1.

| | |
|---|---|
| Pigment-dispersed solution 1 | 125 parts |
| Styrene resin (HIMER ST 95, softening point 95° C., Tg - 12° C. made by Sanyo Chemical Industries, LTD) | 12.3 parts |
| PMMA resin (Dianal BR85, softening point 195° C., Tg = 105° C. made by Mitsubishi Rayon Co., Ltd.) | 5.0 parts |
| Fluorine type surtace active agent (MEGAFACE F178K made by DIC Co.) | 0.2 parts |
| Methyl ethyl ketone | 224 parts |
| Cyclohexanone | 630 parts |

A dispersion average diameter of pigments contained in the prepared ink layer coating solution 1 stated above was 250 nm. Percentage content of pigments for the ink layer 1 formed wag 75.0 weight-%, percentage content of thermoplastic resin having a softening point of not more than 140° C. was 12.3 weight-%, and percentage content of thermosplastic resin having a softening point of not less than 150° C. was 5.0 weight-%. Transmission density (yellow density obtained through measurement by GretagMacbeth Ltd. TD904 densitometer) of the ink layer 1 was 0.29.

(Preparation of Thermal-Transfer Film 2)

Thermal-transfer film 2 was prepared in the same way as in the aforesaid thermal-transfer film 1 prepared, except that ink layer coating solution 2 described below was used in place of the ink layer coating solution 1.

(Ink Layer Coating Solution 2)

Pigment-dispersed solution 2 was prepared under the following structure.

| | |
|---|---|
| White pigment (titanium oxide specific gravity 4.1) | 60.0 parts |
| Dispersing agent A (Solsperse 5000 made by ICI Co.) | 1.0 part |
| Dispersing agent B (Solsperse 24000 made by ICI Co.) | 5.0 parts |
| Methyl ethyl ketone | 34.0 parts |

Then, the pigment-dispersed solution 2 prepared was used for preparing ink layer coating solution 2.

| | |
|---|---|
| Pigment-dispersed solution 2 | 94.8 parts |
| Styrene resin (HIMER ST-95, softening point 95° C., Tg = 42° C. made by Sanyo Chemical Industries, Ltd.) | 32.2 parts |
| PMMA resin (Dianal BR85, softening point 195° C., Tg = 105° C. made by Mitsubishi Rayon Co., Ltd.) | 5.0 parts |
| Fluorine type surface active agent (MEGAFACE F178K made by DIC Co.) | 0.2 parts |
| Methyl ethyl ketone | 238 parts |
| Cyclohexanone | 630 parts |

A dispersion average diameter of pigments contained in the prepared ink layer coating solution 2 stated above was 250 nm Percentage content of pigments for the ink layer 2 formed was 56.9 weight-%, percentage content of thermoplastic resin having a softening point of not more than 140° C. was 32.2 weight-%, and percentage content of thermoplastic resin having a softening point of not less than 150° C. was 5.0 weight-%. Transmission density (yellow density obtained through measurement by GreatagMacbeth Ltd. TD904 densitometer) of the ink layer 2 was C.27.

(Preparation of Thermal Transfer Film 2)

Thermal-transfer film 3 was prepared in the came way as in the aforesaid thermal-transfer film 1 prepared, except that ink layer coating solution a described below was used in place of the ink layer coating solution 1.

(Ink Layer Coating Solution 3)

Pigment-dispersed solution 3 was prepared under the following structure.

| | |
|---|---|
| White pigment (titanium oxide specific gravity 4.1) | 60.0 parts |
| Dispersing agent A (Solsperse 5000 made by ICI Co.) | 1.0 part |
| Dispersing agent B (Solsperse 24000 made by ICI Co.) | 5.0 parts |
| Methyl ethyl ketone | 34.0 parts |

Then, the pigment-dispersed solution 3 prepared was used for preparing ink layer coating solution 3.

| | |
|---|---|
| Pigment-dispersed solution 3 | 94.8 parts |
| Styrene resin (HIMER ST-95, softening point 95° C., Tg = 42° C. made by Sanyo Chemical Industries, Ltd. | 27.2 parts |
| PMMA resin (Dianal BR102, softening point 169° C., Tg = 20° C. made by Mitsubishi Rayon Co., Ltd.) | 10.0 parts |
| Fluorine type surface active agent (MEGAFACE F178K made by DIC Co.) | 0.2 parts |
| Methyl ethyl ketone | 252 parts |
| Cyclohexanone | 630 parts |

A dispersion average diameter of pigments contained in the prepared ink layer coating solution 3 stated above was 250 nm. Percentage content of pigments for the ink layer 3 formed was 56.9 weight-%, percentage content of thermoplastic resin having a softening point of not more than 140° C. was 27.2 weight-%, and percentage content to thermoplastic resin having a softening point of not less than 150° C. was 10.0 weight-%. Transmission density (yellow density obtained through measurement by GretagMacbeth Ltd. TD904 densitometer) of the ink layer 3 was 0.27.

(Preparation of Thermal-Transfer Film 4)

Thermal-transfer film 4 was prepared in the same way as in the aforesaid thermal-transfer film 1 prepared, except that ink layer coating solution 4 described below was used in place of the ink layer coating solution 1.

(Ink Layer Coating Solution 4)

Pigment-dispersed solution 4 was prepared under the following structure.

| | |
|---|---|
| White pigment (titanium oxide specific gravity 4.1) | 60.0 parts |
| Dispersing agent A (Solsperse 5000 made by ICI Co.) | 1.0 part |
| Dispersing agent B (Solsperse 24000 made by ICI Co.) | 5.0 parts |
| Methyl ethyl ketone | 34.0 parts |

Then, the pigment-dispersed solution 4 prepared was used for preparing ink layer coating solution 4.

| | |
|---|---|
| Pigment-dispersed solution 4 | 79.4 parts |
| Styrene resin (HIMER ST-95, softening point 95° C., Tg = 42° C. made by Sanyo Chemical Industries, Ltd.) | 42.4 parts |
| PMMA resin (Dianal BR85, softening point 195° C., Tg = 105° C. made by Mitsubishi Rayon Co., Ltd.) | 5.0 parts |
| Fluorine type surface active agent (MEGAFACE F178K made by DIC Co. | 0.2 parts |
| Methyl ethyl ketone | 243 parts |
| Cyclohexanone | 630 parts |

A dispersion average diameter of pigments contained in the prepared ink layer coating solution 4 stated above was 250 nm. Percentage content of pigments for the ink layer 4 formed was 47.6 weight-%, percentage content of thermoplastic resin having a softening point of not more than 140° C. was 42.2 weight %, and percentage content of thermoplastic resin having a softening point of not less than 150° C. was 5.0 weight-%. Transmission density (yellow density obtained through measurement by Macbeth TD904 densitometer) of the ink layer 4 was 0.26.

(Preparation of Thermal-Transfer Film 5)

Thermal-transfer film 5 was prepared in the same way as in preparation of the aforesaid thermal-transfer film 1, except that an added amount of pigment-dispersed solution 1 used in ink layer 1 was adjusted, and ink layer coating solution 5 wherein percentage content white pigment was changed to 19.0 weight-% was used.

The EV-Laser-proofer made by Konica Corp was used as an exposure equipment and Color Decision CD-2R made by Konica Corp. was used as an image reception film.

An exposure plane power of 100 mW/ch and the number of revolutions of 460–680 r.p.m. were used as exposure conditions. The exposure plane power in this came was 3.2 W. After the exposure, transfer was conducted onto Tokubishi art paper made by Mitsubichi Paper Sales Co., Ltd by EV-laminator, and images for evaluation were prepared. Each of the images obtained was evaluated for its solid image quality and fine line reproduction. In the solid image quality, those judged to be excellent in covering power without image minimum density and judged to be similar to white printed matters in terms of texture were evaluated to be "E" (Excellent), and those which have image minimum density and are inferior in terms of covering power and are clearly different from white printed matters in terms of texture were evaluated to be "I" (inferior). Incidentally, the number of revolutione which made solid density to be constant wag 460–620 r.p.m. In the fine line reproduction, those clearly reproduced line & space of 2000 dpi under the EV-Laser-proofer made by Konica Corp were evaluated to be "E" (Excellent), and those which did not reproduce relatively were evaluated to be "I" (inferior). Incidentally, dpi mentioned in the invention indicates the number of dots per 2.54 cm (1 inch).

Table 1 show results of evaluation obtained in the foregoing.

TABLE 1

| Thermal-transfer film Nos. | Characteristic values of an ink layer: Percentage content of thermoplastic resin (%) | Percentage content of pigment (%) | Average transmittance (T %) | L* value | Solid image quality | Fine line reproduction | Remarks |
|---|---|---|---|---|---|---|---|
| 1 | 17.3 | 75 | 53 | 75 | E | E | Inv. |
| 2 | 37.2 | 56.9 | 56 | 74 | E | E | Inv. |
| 3 | 37.2 | 56.9 | 56 | 74 | E | E | Inv. |
| 4 | 47.2 | 47.6 | 55 | 73 | E | E | Inv. |
| 5 | 79 | 19 | 72 | 51 | 1 | 1 | Comp. |

Inv.; Present invention
Comp.; Comparative example (Evaluation of Characteristics)

(Measurement of an Average Transmittance and an L* Value of the Ink Layer)

Each of the ink layer coating solutions 1–5 prepared as stated above was coated on a 25 μm thick polyethylene terephthalate film at a rate of dry mass of 2.0 g/$m^2$, and each sample thus obtained was subjected to measurement by a spectrophotometer for absorption spectra in a range of 350–650 nm, to obtain an average transmittance in that wavelength area Incidentally, HITACHI U-3000/3300 type auto-spectrophotometer made by Hitachi, Ltd. was used as a spectrophotometer.

Then, each of the sample coated on PET was subjected to measurement for an L*value on the coated surface. For the measurement, a black background showing black density (GRETAG D196) of 2.74 was used for groundwork, and GRETAG SPM100-II (D50, 2° visual field standard) was used as an measuring instrument.

(Evaluation of Image Quality)

The thermal transfer films 1 to 5 prepared as stated above were used for evaluation of image quality.

As is apparent from Table 1, thermal-transfer films 1–4 of the invention proved to be excellent in fine line reproduction and solid image quality, compared with comparative example, and with regard to the image quality obtained, no image minimum density was observed, covering power was excellent, and texture was extremely close to white printed matters.

The invention has made it possible to provide a laser thermal-transfer film for high image quality capable of reproducing, with the same texture as in printed matters, the special colors which cannot be reproduced by organic pigments.

What is claimed is:

1. A laser thermal-transfer film to transfer an ink image by being imagewise exposed with a laser beam comprising:

a support; a light-heat conversion layer; and ink layer having at least two thermoplastic resins and a pigment, wherein an average transmittance of the ink layer for a light having wavelength of 350 to 650 nm is not more than 70% and L* value of the ink layer is not less than 60, and wherein the thermoplastic resins comprises a first thermoplastic resin having a melting point or a softening point of 140° C. or less and a second thermoplastic resin having a melting point or a softening point of 150° C. or more.

2. The laser thermal-transfer film of claim 1, wherein the ink layer comprises the first and second thermoplastic resin of 10% by weight or more in total and the density of the ink layer is 1.2 to 4 kg/l.

3. The laser thermal-transfer film of claim 1, wherein the ink layer comprises the first and second thermoplastic resin of 77% by weight or less in total and the pigment of 20% by weight or more, and the density of the pigment is 2.0 kg/l or more.

4. The laser thermal-transfer film of claim 1, wherein the pigment comprises at least a compound selected from the group consisting of a titanium compound, an aluminum compound, a lead compound, a silver compound, a molybdenum compound, an iron compound, a copper compound and a zinc compound.

5. The laser thermal-transfer film of claim 1, wherein the ink layer contains the first thermoplastic resin of 8 to 55% by weight and the second thermoplastic resin of 2.0% by weight or more.

6. The laser thermal-transfer film of claim 1, wherein dispersion average diameter of the pigment is not more than 2.0 $\mu$m.

7. The laser thermal-transfer film of claim 1, wherein he thickness of the ink layer is not more than 2.0 $\mu$m.

8. The laser thermal-transfer film of claim 1, wherein an adhesion amount of the ink layer is not less than 0.8 $g/m^2$.

9. The laser thermal-transfer film of claim 1, wherein an average transmission density of the ink layer for a light having a wavelength of 350 to 650 nm is not more than 0.8.

10. The laser thermal-transfer file of claim 4, wherein the pigment comprising at least a compound selected from a group consisting of titanium dioxide, aluminum powder and bronze powder.

11. The laser thermal-transfer film of claim 1, wherein the laser thermal-transfer film further comprises a cushion layer between the support and the light-heat conversion layer.

12. A laser thermal-transfer film to transfer an ink image by being imagewise exposed with a laser beam, comprising:

a support;

a light-heat conversion layer;

an ink layer having at least one kind of a thermoplastic resin and pigment; and a cushion layer between the support and the light-heat conversion layer, the cushion layer having a TMA softening point of not more than 70° C., wherein an average transmittance of the ink layer for a light having wavelength of 350 to 650 nm is not more than 70% and L* value of the ink layer is riot less than 60.

* * * * *